United States Patent [19]

Ogoshi

[11] Patent Number: 5,688,365
[45] Date of Patent: Nov. 18, 1997

[54] METHOD OF MAKING SEMICONDUCTOR DEVICE

[75] Inventor: Ken Ogoshi, Suwa, Japan

[73] Assignee: Seiko Epson Corporation, Tokyo, Japan

[21] Appl. No.: 604,700

[22] Filed: Feb. 21, 1996

[30] Foreign Application Priority Data

Feb. 21, 1995 [JP] Japan ................................. 7-032709
Dec. 29, 1995 [JP] Japan ................................. 7-353473

[51] Int. Cl.$^6$ ................................................. H01L 21/00
[52] U.S. Cl. ........................... 156/661.11; 156/656.1; 216/47; 216/102; 437/229
[58] Field of Search ...................... 156/654.1, 659.11, 156/661.11, 643.1, 656.1; 216/41, 47, 67, 102; 437/229; 430/312, 313

[56] References Cited

U.S. PATENT DOCUMENTS 4,557,797  12/1985  Fuller et al. ................... 437/229 X Primary Examiner—William Powell
Attorney, Agent, or Firm—Oliff & Berridge

[57] ABSTRACT

This invention provides a method for making a semiconductor device. The method applies an uniform thickness of an Anti-Reflection Coat (ARC) to improve the dimensional controllability of a resist pattern by sufficiently exposing a resist layer using the ARC without reduction of the throughout. A layer to be etched is formed over a portion of a substrate surface including a step portion. A first resist layer sensitive to a first exposure light is formed on the layer to be etched. The first resist layer has a film thickness equal to or less than 1.5 μm and reduces a height of the step. The ARC material has a low reflectance relative to a second exposure light and is formed on the first resist layer with a thickness equal to or less than 0.2 μm. A second resist layer sensitive to a second exposure light is formed on the ARC material. The second resist layer is patterned by the second exposure light. The pattern in the second resist layer is also formed on the ARC material. The first resist layer is exposed to the first exposure light using the pattern as a mask. Thereafter, the first resist layer is developed and used as a mask to etch the layer to be etched.

22 Claims, 10 Drawing Sheets

METHOD OF MAKING SEMICONDUCTOR DEVICE

BACKGROUND OF THE INVENTION

1. Field of the Invention

The present invention relates to a method of making a semiconductor device and particularly to such a method suitable for fine processing.

2. Description of the Related Art

In recent years, semiconductor devices have increasingly been processed into finer structures to improve the integration and/or added value thereof. Thus, very high level of fine-processing technique is required in the field of superposition, dimension or foreign matter control.

FIG. 10 shows a fine-processing technique used in the prior art. In FIG. 10, an aluminum wiring layer 52 is on a substrate 51. A layer to be etched 53, which consists of oxide layer, is further formed on the overall surface of the substrate 51. A resist layer 54 is applied on the layer to be etched 53 to form a masking layer which is used to process the layer to be etched 53.

To form a pattern on the resist layer 54, the resist layer 54 is exposed through a mask 57. When the resist layer 54 is positive, a portion to be exposed 55 will be exposed and developed to form a pattern.

Since very high level of dimensional accuracy is required as the semiconductor structure becomes finer, dimensional change due to the reflection on the underlayer of the resist layer 54 cannot be neglected. More particularly, such a phenomenon is halation as represented by an optical path 56 in FIG. 10. The reduction of dimensional accuracy due to halation on the layer to be etched 53 depends on the reflectance of the layer to be etched 53 relative to the exposure light. If an aluminum or other layer having a higher reflectance relative to the exposure light exists under the layer to be etched which comprises of oxide layer, or if the layer to be etched itself is formed of a metal such as aluminum or tungsten silicide, such a tendency increases.

One of the conventional techniques for overcoming such a problem is use of a dye-containing resist in which dye reduces the transmissivity of the resist itself.

However, the resistance efficiency is reduced by the dye contained in the resist. So, such a technique is being unsuitable for the most recent semiconductor device producing process which requires finer patterns. The use of dye-containing resist does not completely solve the problem of halation.

More recently, an Anti-Reflection Coat (ARC) technique has been developed. The ARC technique is classified into two types, overcoating and undercoating.

FIGS. 11A and 11B show an undercoating type ARC technique which is effective for halation. In FIG. 11A, an aluminum wiring layer 62 is on a substrate 61. A layer to be etched 63 is further formed on the substrate 61. An ARC material 64 is applied over the layer to be etched 63 to prevent a light used to expose the layer to be etched 63 from being reflected therefrom. A resist layer 65 is further formed over the ARC material 64.

According to this exposure process using an ARC technique, a resist portion to be exposed 66 in the resist layer 65 is exposed through a mask 68 to form a pattern on the resist layer 65, similar to the conventional art. The ARC material 64 may be of such a type that a pattern portion 67 in an ARC layer below the portion to be exposed 66 is removed by a wet-etching effect from a developer when the resist layer is developed. The other type of the ARC material is such that the pattern portion 67 of the ARC layer is removed by dry-etching through the upper resist layer 65 serving as a masking layer, rather than the development. The former provides a shortened process, but tends to etch the sides of the resist layer through the wet-etching. This is more or less disadvantageous in dimensional accuracy. The latter provides a higher dimensional controllability, but increases the number of steps. In any event, such a process as shown in FIG. 11B will be carried out after the ARC material 64 has been locally removed.

However, the prior art shown in FIGS. 11A and 11B have the following problems. Since the ARC material 64 is applied directly to the layer to be etched 63 having a sharp step, the ARC material 64 will have unequal thickness. Since the effect of the ARC material 64 preventing the reflection of the exposing light depends on the film thickness thereof, such inequality in the film thickness of the ARC material 64 will provide different reflectances relative to the exposing light. As a result, the dimensions of the resist pattern on the step may be different from the desired level. Therefore, the ARC material may result in reduction of the dimensional control so that the dimensional accuracy required by the semiconductor device cannot be accomplished.

SUMMARY OF THE INVENTION

It is therefore an object of the present invention to provide a method of making a semiconductor device, in which the ARC material can uniformly be applied to the layer to be etched formed over a stepped portion when the layer to be etched is etched and in which the resist layer is sufficiently exposed to improve the dimensional controllability of the resist pattern without reduction of the throughput.

Another object of the present invention is to provide a method of making a semiconductor device, in which a flattening layer for uniformly applying the ARC material can be formed to etch the layer to be etched with an improved accuracy and without addition of a lithographic step.

To this end, the present invention provides a method of making a semiconductor device. A substrate of the semiconductor device has a first layer and a second layer. The first layer is disposed over a portion of a surface of the substrate forming a first step between a surface level of the substrate and a surface level of the first layer. The second layer is disposed over the first layer and the surface of the substrate covering the first step.

The method forms a first resist layer on the second layer. The first resist layer forms a second step over the first step. A height of the second step is less than a height of the first step by at least about 70%. The first resist layer has a thickness less than about 1.5 µm and is sensitive to a first exposure light.

A first anti-reflection coat is formed on the first resist layer. The first anti-reflection coat has a thickness less than about 0.2 µm and has a first reflectance value relative to the second exposure light. The first and second layers have a second reflectance value and a third reflectance value, respectively, relative to the second exposure light. The first reflectance value is less than at least one of the second and third reflectance values.

A second resist layer is formed on the first anti-reflection coat. The second resist layer is sensitive to the second exposure light. A first pattern is formed on the second resist layer by exposing the second resist layer to the second exposure light and developing the second resist layer.

A second pattern is formed on the first anti-reflection coat. The second pattern is substantially the same as the first pattern on the second resist layer. A third pattern is formed on the first resist layer by exposing the first resist layer to the first exposure light and developing the first resist layer. The third pattern is formed using the second resist layer and the first anti-reflection coat as a first mask and a second mask. The third pattern is substantially the same pattern as the first pattern on the second resist layer. Finally, the second layer is etched using at least the first resist layer as a third mask.

According to the present invention, between the layer to be etched and the anti-reflection coat is formed the first resist layer having such a film thickness that reduces a difference in level at the layer to be etched due to the stepped portion by at least about 70%. Therefore, the anti-reflection coat can be formed into a substantially uniform film thickness. Since the anti-reflection coat is further formed on the first flattened resist layer, the anti-reflection coat can be formed into a uniform film thickness equal to or less than about 2 μm and preferably equal to or less than about 1.5 μm. Thus, the pattern accuracy in the second resist layer above the anti-reflection coat can be maintained higher. The anti-reflection coat and the first resist layer are patterned using the second resist layer having its higher accuracy as a masking layer, resulting in improvement of the dimensional accuracy in the etched portion of the layer to be etched. Particularly, since the film thickness of the anti-reflection coat is equal to or less than about 0.2 μm, the factors of side-etch leading to dimensional variations and configurative degradation in the pattern portion of the anti-reflection coat can be reduced. This can also improve the dimensional accuracy in the etched portion of the layer to be etched.

According to the present invention, furthermore, the first resist layer is formed into a film thickness equal to or less than about 1.5 μm. When the first resist layer is exposed using a layer above the first resist layer as a masking layer, therefore, the first resist layer can sufficiently be exposed in the direction of film thickness without reduction of the throughput.

In this regard, it is preferred that the thickness of the first resist layer is less than two times the height of the stepped portion.

It is preferred that the second resist layer is formed from a material having a higher resolution than that of the first resist layer. This is because the patterning accuracy in a layer below the second resist layer (including the first resist layer) depends on the patterning accuracy in the second resist layer.

On the other hand, it is preferred that the first resist layer is formed from a material having a higher light sensitivity than that of the second resist layer. Thus, the throughput can be improved when the first resist layer is exposed through the upper masking layer.

A light absorbing agent may be mixed into the first resist layer. Thus, the exposure accuracy in the second resist layer can further be improved.

In the step of forming a pattern on the anti-reflection coat, the second resist layer can be used as a masking layer to wet-etch the anti-reflection coat. Since the patterning accuracy of the second resist layer has been improved, the anti-reflection coat can be patterned with an accuracy higher than the prior art.

In the step of forming a pattern on the anti-reflection coat, it is further preferred that the anti-reflection coat is dry-etched using the second resist layer as a masking layer. Thus, the side-etching can be reduced in the pattern portion of the anti-reflection coat. This further improves the patterning accuracy in the anti-reflection coat.

The method of the present invention may further comprise a step of forming another anti-reflection coat of overcoating type on the second resist layer. In such a case, a multiple interference of the second exposure light in the second resist layer can be avoided when the second resist layer is exposed to the second exposure light. Thus, the patterning accuracy in the second resist layer can further be improved. If it is assumed that the second resist layer has refractive index n relative to the second exposure light, it is preferable that such refractive index n is larger than refractive index N of the another anti-reflection coat relative to the second exposure light. If it is assumed that a wavelength of the second exposure light is λ, it is also preferable that film thickness d of the another anti-reflection coat is substantially equal to λ/4N. Thus, the multiple interference of the second exposure light in the second resist layer can effectively be prevented. Particularly, as the refractive index N of the another anti-reflection coat relative to the second exposure light approaches $(n)^{1/2}$, the multiple interference can further be prevented.

The method of the present invention may further comprise a step of forming an opaque film on the second resist layer. In such a case, a part of the opaque film exposed to the second exposure light will be changed into a transparent portion in the second resist layer exposing step. In such an exposing step, furthermore, the second resist layer will be exposed to the second exposure light through the transparent portion of the opaque film. Thus, the exposure light is suppressed from entering outside of the pattern portion of the second resist layer to improve the patterning accuracy in the second resist layer.

It is preferred that the first exposure light is an excimer laser beam. This is because the diffraction of the first exposure light on the anti-reflection coat reduces as the wavelength of the exposure light becomes smaller when the first resist layer is exposed. This improves the patterning accuracy in the first resist layer.

The second exposure light may be an i-ray or excimer laser beam, depending on the working size in the second resist layer.

In a further aspect, the present invention provides a method of making a semiconductor device, comprising the steps of:

forming a layer to be etched over a portion including a stepped portion formed on a substrate;

forming a flattening layer on the layer to be etched to reduce a difference in level;

forming an anti-reflection coat having a lower reflectance relative to an exposure light on the flattening layer;

forming a resist layer of a material which is sensitive to the exposure light on the anti-reflection coat to a thickness larger than the height of the stepped portion;

exposing the resist layer to the exposure light and then developing to remove the resist layer for forming a pattern; and thereafter performing an anisotropically etching process to overall surface of layers on the substrate to remove a part of the layer to be etched corresponding to the pattern on the resist layer.

Even if the flattening layer is added to form a uniform anti-reflection coat, no lithographic step of patterning the flattening layer is required. The flattening layer is etched at the same time when the layer to be etched is etched using the resist layer above the anti-reflection coat as a mask.

The anti-reflection coat can function as an overcoat on the flattening layer. In such a case, the anti-reflection coat can transmit the exposure light which has entered the anti-reflection coat through the resist layer. The transmitted light can be confined in the flattening layer. Thus, the patterning accuracy in the resist layer above the anti-reflection coat can be improved.

It is preferred that the refractive index n of the resist layer relative to the exposure light is larger than the refractive index N of the anti-reflection coat relative to the exposure light. It is further preferred that the refractive index N of the anti-reflection coat relative to the exposure light is nearly $(n)^{1/2}$. It is further preferred that if it is assumed that a wavelength of the exposure light is $\lambda$, film thickness d of the flattening layer is substantially equal to $\lambda/2N$. Thus, the effect of confining the exposure light in the flattening layer can be improved.

Since it is not required to pattern the flattening layer through the lithographic step, the flattening layer can be formed from a material which is not sensitive to the exposure light, for example, a resist having no light sensitive function.

BRIEF DESCRIPTION OF THE DRAWINGS

The invention will be described in detail with reference to the following drawings, wherein like numerals represent like elements and.

DETAILED DESCRIPTION OF THE PREFERRED EMBODIMENTS

Some embodiments of the present invention will now be described with reference to the drawings.

First Embodiment

Figure 1:
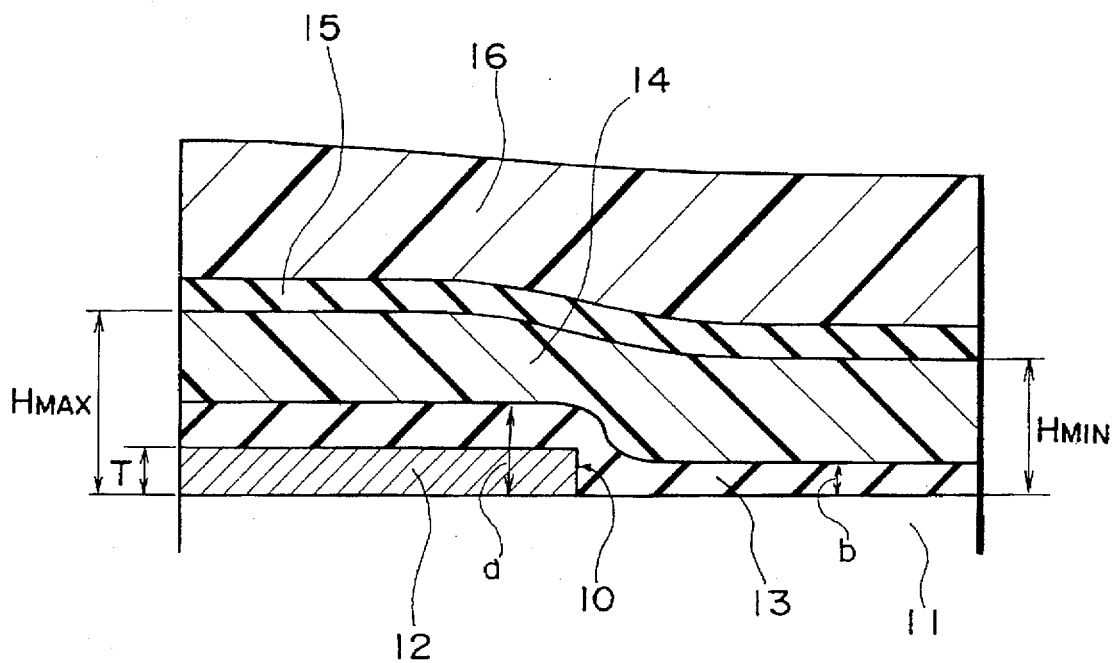
FIG. 1 is a schematic vertical sectional view illustrating a film forming step in a first embodiment of a semiconductor device making method according to the present invention.

Referring now to FIG. 1, an aluminum(Al) wiring layer 12 is formed on a substrate 11. The aluminum wiring layer 12 has previously been patterned through a lithographic step. The substrate 11 includes a stepped portion 10 between a portion including the aluminum wiring layer 12 and another portion not including the aluminum wiring layer 12. The stepped portion 10 has a height T that is equal to the film thickness of the aluminum wiring layer 12 (which is equal to about 0.4 µm in the first embodiment). The overall surface of the substrate 11 on which the stepped portion 10 is formed is covered with a layer to be etched 13 which is formed of oxide film. At this time, a difference in level at the layer to be etched 13 is equal to (a–b) which is smaller than the height T of the stepped portion 10.

A first resist layer 14 having a sensitivity is spin-coated to the top of the layer to be etched 13 to a thickness equal to about 0.7 µm that is less than two times the height T of the stepped portion 10 in order to reduce a difference in level. After the spin-coating, the substrate is baked for about 90 seconds at a temperature of about 70° C. The first resist layer 14 is formed to reduce a difference in level caused by the layer to be etched 13 or the height (a–b) by at least about 70%. Thus, any sharp step will not be formed on the surface of the first resist layer 14. Namely, the first resist layer 14 has a difference in level that is equal to or less than about 30% of the difference in level at the layer to be etched 13 or the height (a–b), due to the stepped portion 10. In other words, a value, $[(H_{MAX}-H_{MIN})/(a-b)]\times 100(\%)$, is equal to or less than about 30% where $H_{MAX}$ is the maximum distance between the top of the substrate 11 and the top of the first resist layer 14 and $H_{MIN}$ is the minimum distance.

It is preferable for this flattening step that the film thickness of the first resist layer 14 is large. In view of the subsequent exposure, however, it is not preferred that the film thickness of the first resist layer 14 is too large, since a layer below the first resist layer 14 will particularly be imperfectly exposed. Therefore, the thickness of the first resist layer 14 is preferably equal to or less than about 1.5 µm. In this embodiment, the thickness of the first resist layer 14 is selected to be about 0.7 µm that is less than two times the height T of the stepped portion 10.

The height T of the stepped portion 10 is equal to the film thickness of the aluminum wiring layer 12 which is up to about 0.8 µm. Thus, thickness of the first resist layer 14 is limited to about 1.5 µm that is less than two times the maximum height of the stepped portion 10, and can be sufficiently used to reduce a difference in level even if the thickness is less than about 1.5 µm. If the first resist layer has its thickness equal to or smaller than about 1.5 µm, the exposure can sufficiently be performed in the direction of thickness.

Anti-Reflection Coat(ARC) material 15 is spin-coated to this flattened surface with a thickness of about 0.2 µm. Since the surface to be covered with the ARC material 15 has previously been flattened by applying the first resist layer 14, the ARC material can uniformly be coated with its thickness of only about 0.2 µm. If the first resist layer 14 or the flattened layer does not exist, the ARC material should be applied into a thickness equal to about 0.5 µm. However, this embodiment can apply the ARC material into a thin film equal to about 0.2 µm. This can reduce factors of side-etch leading to the dimensional variations and configurative degradation in the pattern portion 15a (see FIG. 2) of the ARC material 15 when the ARC material is removed using an upper or second resist layer 16 as a mask, as will be described.

Thereafter, the second resist layer 16 having a light sensitivity is formed on the ARC material 15 through the spin-coating, with a thickness of about 1.1 µm. These layers are then baked for about 90 seconds at a substrate temperature of about 90° C.

Figure 2:
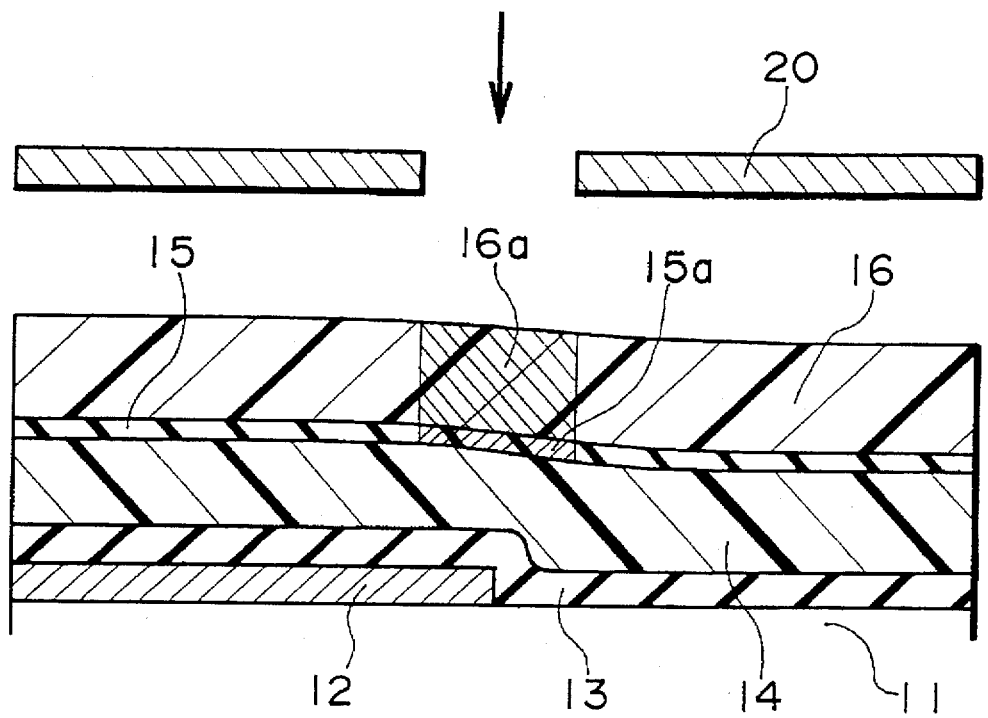
FIG. 2 is a schematic vertical sectional view illustrating a second resist layer exposing step in the first embodiment of the present invention.

As shown in FIG. 2, the second resist layer 16 is then patterned. To form a pattern on the second resist layer 16, a portion to be exposed 16a is exposed through a mask 20 and then developed to remove the portion to be exposed 16a.

At this time, most of the exposure light is absorbed by the ARC material 15 because the ARC material 15 has a low reflectance value relative to the exposure light. Thus, less exposure light will be reflected from the lower aluminum wiring layer 12. Therefore, the reflection of the exposure light from the aluminum wiring layer 12 is so suppressed to provide no influence to the pattern formation. A light absorbing agent may be mixed into the first resist layer 14 to reduce the reflection of the exposure light from the aluminum wiring layer 12.

The reflectance value of the ARC material 15 is lower than a reflectance value of the aluminum wiring layer 12. Thus, the exposure light reflected from the ARC material 15 is less than the light reflected from the aluminum wiring layer 12. Since less exposure light is reflected from the ARC material 15, patterning of the second resist layer 16 is improved.

If the layer to be etched 13 includes materials other than the oxide, such as aluminum or tungsten silicide, the ARC material 15 also suppresses the reflection of the exposure light from the layer to be etched 13. Thus, the ARC material 15 prevents the layer to be etched 13 to influence the patterning of the second resist layer 16. Accordingly, the aluminum wiring layer 12 or the layer to be etched 13 are prevented from influencing the patterning of the second resist layer 16 by setting the reflectance value of the ARC material 15 to be lower than reflectance values of at least one of the aluminum wire layer 12 and the layer to be etched 13.

Figure 3:
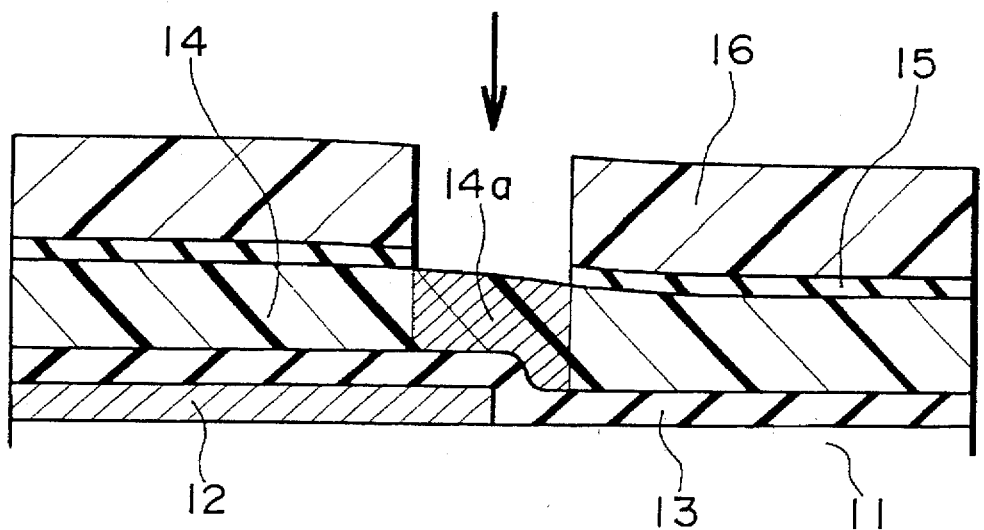
FIG. 3 is a schematic vertical sectional view illustrating a first resist layer exposing step in the first embodiment of the present invention.

According to this embodiment, the pattern portion 15a of the ARC material 15 below the portion to be exposed 16a is removed at the same time when the second resist layer 16 is developed. In this case, the pattern portion 15a of the ARC material 15 has solubility relative to the alkaline developer, thus being wet-etched on the development step. As shown in FIG. 3, thus, the second resist layer 16 and the ARC material 15 are simultaneously patterned. In addition, the pattern portion 15a can be processed with an improved accuracy and substantially without the configurative variations such as side-etching because the layer of the ARC material 15 is very thin, that is, equal to about 0.2 µm. From a viewpoint that the configurative variations of the pattern portion 15a should be controlled, the thickness of the ARC material 15 is preferably equal to or smaller than about 0.2 µm and more preferably ranges between about 0.15 µm and 0.10 µm. If the thickness of the ARC material 15 is smaller than the lower limit, that is, about 0.10 µm, it is difficult to form the ARC material 15 into a uniform film. Furthermore, the reflection from the undercoat will increase.

The subsequent steps depend on the dimensional accuracy in a pattern portion 16a of the second resist layer 16. It is thus preferable that the second resist layer 16 is formed of a material having its higher resolution relative to the exposure light for the second resist layer 16. It is thus preferable that the second resist layer 16 is formed of a material having its resolution higher than that of the first resist layer 14, for example, such a material that can be resolved an image having its dimensions equal to or smaller than the wavelength of the exposure light.

In view of a resolution for fine pattern, the exposure light for the second resist layer 16 may have an optimum wavelength depending on the process dimensions. For example, the i-ray can preferably be used when the process dimensions up to about 0.35 µm. The excimer laser can preferably be used when the work dimensions up to about 0.25 µm.

As shown in FIG. 3, thereafter, the exposure is carried out against the substrate 11 without use of the mask 20. At this time, a portion of the first resist layer 14 other than a pattern portion 14a will not substantially be exposed since such a portion includes a layer of the ARC material 15 having higher absorptivity relative to the exposure light, and the second resist layer 16. Actually, this portion more or less transmits the exposure light to produce some photochemical reaction. However, it is almost impossible that this portion will be developed since the developer can only contact the pattern portion 14a of the first resist layer 14. Since the film thickness of the first resist layer 14 is very thin, that is, equal to about 0.7 µm, the first resist layer 14 can perfectly be exposed in the direction of thickness.

It is preferred that the exposure light used for the first resist layer 14 is a light beam having its shorter wavelength, e.g., an excimer laser beam. As the wavelength of the exposure light is shorter, diffraction at the patterned portion of the ARC material 15 becomes smaller, resulting in improvement of the dimensional accuracy.

In view of the fact that the first resist layer 14 is subjected to the exposure, it is preferable that the first resist layer 14 is formed of a material having a higher light sensitivity. It is thus preferred that the first resist layer 14 is formed of a material having a light sensitivity higher than that of the second resist layer 16, for example, a material having a light sensitivity equal to or lower than about 100 mJ/mm$^2$.

After development, the substrate 11 is baked for about 120 seconds at about 115° C. to improve the etching-resistance thereof.

Figure 4:
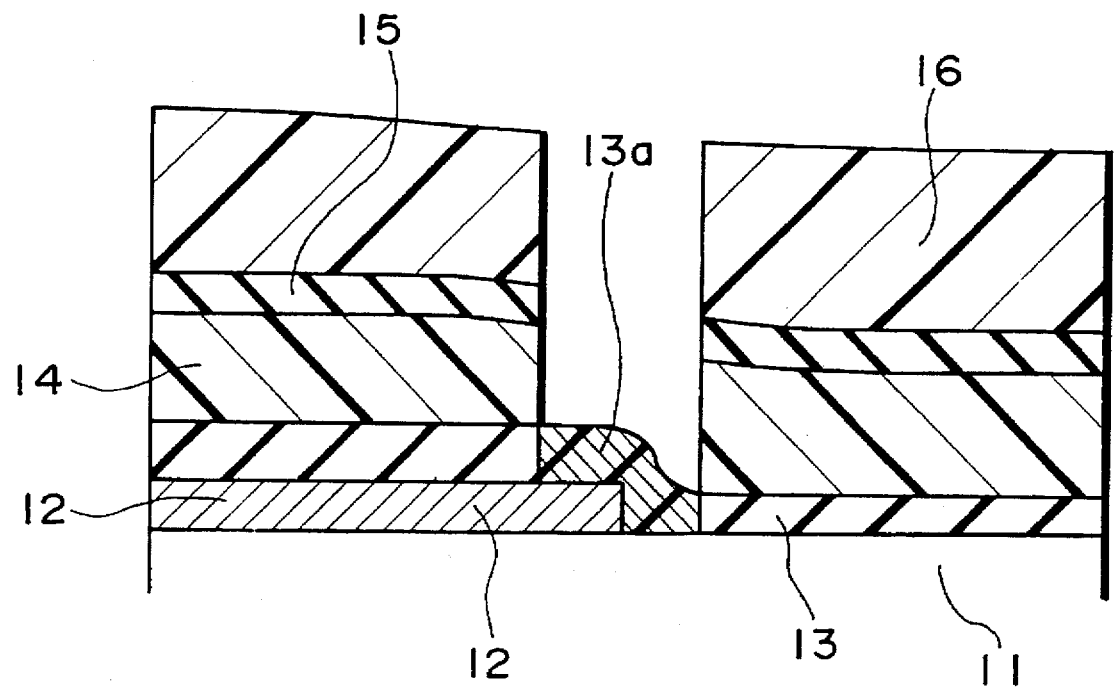
FIG. 4 is a schematic vertical sectional view illustrating a step of etching a layer to be etched in the first embodiment of the present invention.

As shown in FIG. 4, the first resist layer 14, ARC material 15 and second resist layer 16 which have been patterned are then used as masking layers to perform a dry-etching step which removes a portion 13a of the layer to be etched 13 formed of oxide film. At this time, the dimensional accuracy in the layer to be etched 13 is also improved since the dimensional accuracy in the upper masking layers is higher. In the production of semiconductor device, the dimensional accuracy can overall be improved, also leading to improvement of the resulting semiconductor devices.

The dimensional controllability for lines and spaces of about 0.5 µm width in this embodiment will be shown in Table 1.

TABLE 1*

|  | Average value | 3 σ | Difference |
|---|---|---|---|
| Prior Art | 0.505 | 0.045 | 0.060 |
| First Embodiment | 0.495 | 0.035 | 0.050 |

Unit: μm  *Results of measurement at nine points

Table 1 shows averaged values, dispersions 3 σ and differences between the maximum and minimum values relating to different sizes at nine points in the plane of the substrate 11, respectively, in the prior art having no flattening layer and the first embodiment of the present invention.

As will be apparent from this table, the first embodiment of the present invention can greatly improve the dispersion and difference, in comparison with the prior art.

Second Embodiment

The second embodiment of the present invention will now be described with reference to FIGS. 5A to 5C.

Figure 5A:
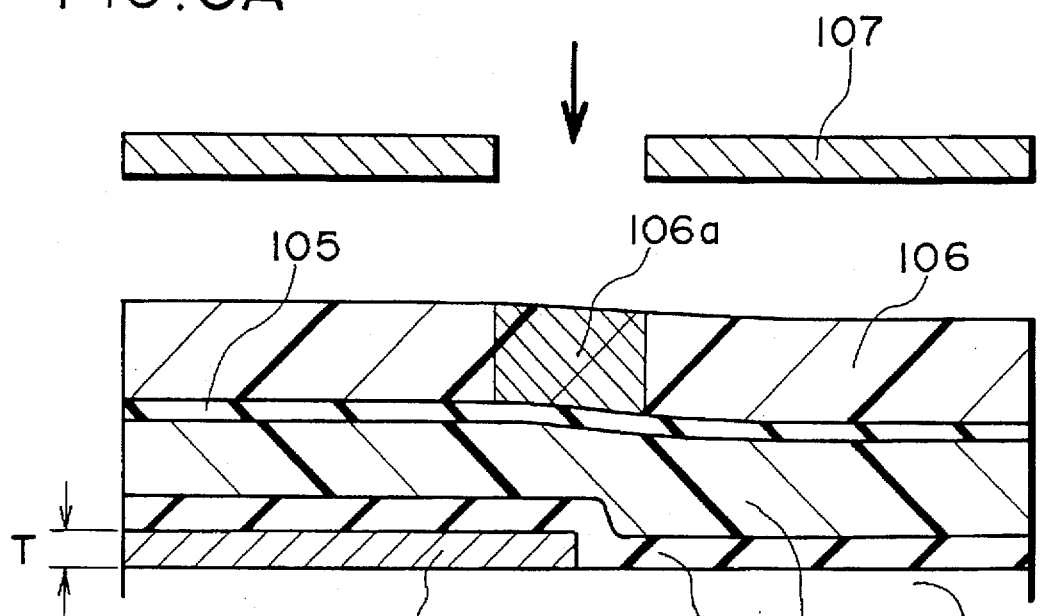
FIG. 5A is a schematic vertical sectional view illustrating a second resist layer exposing step in a second embodiment of the present invention.

Referring first to FIG. 5A, an aluminum wiring layer 102 having a thickness T=0.4 μm and a layer to be etched 103 comprising oxide film are formed on a substrate 101. As in the first embodiment, a first flattening resist layer 104, an ARC material 105 and a second resist layer 106 are applied above the layer to be etched 103 with the respective thickness of about 0.7 μm, 0.2 μm and 1.1 μm.

Figure 5B:
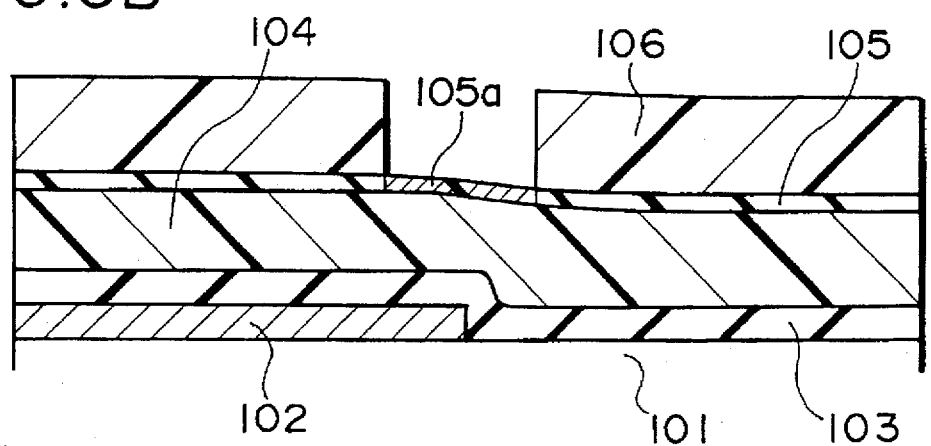
FIG. 5B is a schematic vertical sectional view illustrating an ARC material etching step.
Figure 5C:
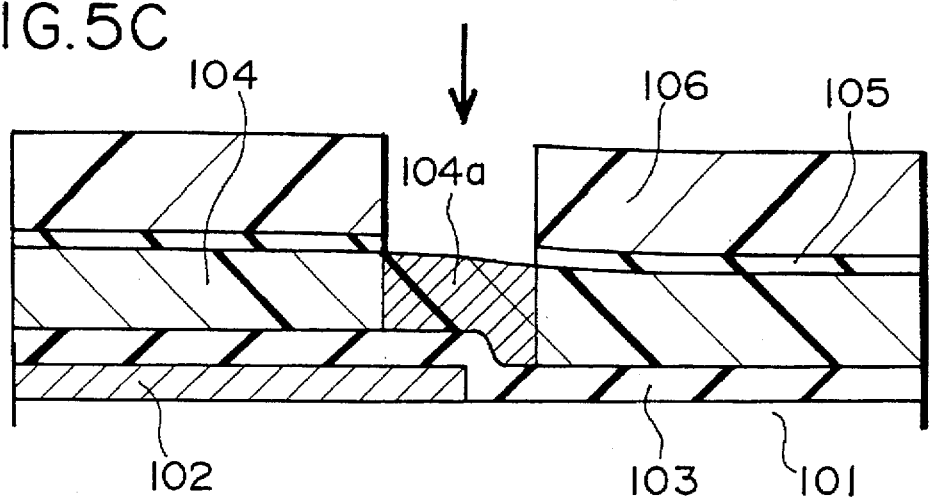
FIG. 5C is a schematic vertical sectional view illustrating a first resist layer exposing step.

As in the first embodiment, a portion to be exposed 106a of the second resist layer 106 is exposed through a mask 107 and then developed to remove said portion to be exposed 106a for forming a pattern on the second resist layer 106, as shown in FIG. 5B. At this time, an ARC material 105 suppresses the reflection of the exposure light from the aluminum wiring layer 102 to such a degree that the reflection will not influence the formation of pattern. The second embodiment is different from the first embodiment in that the pattern portion 105a of the ARC material 105 below the portion to be exposed 106a does not have solubility relative to the alkaline developer. Therefore, the pattern portion 105a of the ARC material 105 remains after development.

To remove the pattern portion 105a of the ARC material 105, an oxygen plasma etching is carried out using the resist layer 106 as a mask. Such a pattern as shown in FIG. 5C is thus formed.

As in the first embodiment, the substrate 101 is then exposed without use of any mask. At this time, a portion of the first resist layer 104 other than its pattern portion 104a will not substantially be exposed since such a portion includes the ARC material 105 having its higher exposure light absorption and the second resist layer 106.

After development, the substrate 101 is baked for about 120 seconds at about 115° C. to improve its etching-resistance. Thereafter, an etching process for the layer to be etched 103 is performed as in FIG. 4.

The dimensional controllability for lines and spaces of about 0.50 μm width in the second embodiment is shown in Table 2.

TABLE 2*

|  | Average value | 3 σ | Difference |
|---|---|---|---|
| Prior Art | 0.505 | 0.045 | 0.060 |
| Second Embodiment | 0.498 | 0.030 | 0.045 |

Unit: μm  *Results of measurement at nine points

As will be apparent from the table 2, the second embodiment can also greatly improve the dispersion and difference between the maximum and minimum values, in comparison with the prior art. In addition, the dimensional controllability of the second embodiment is superior to that of the first embodiment shown in the table 1. It is believed that this is because the pattern portion 105a of the ARC material 105 is removed through the etching.

Third Embodiment

Figure 6:
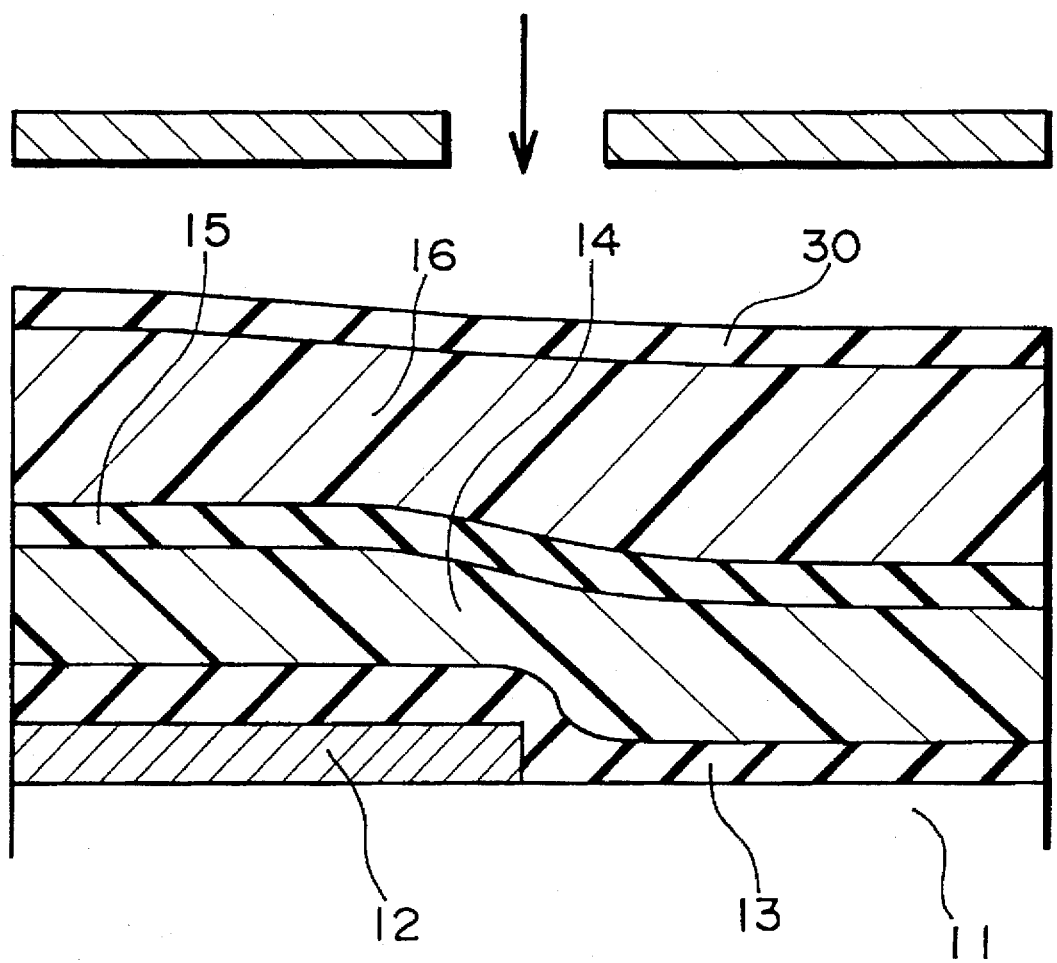
FIG. 6 is a schematic vertical sectional view illustrating a second resist layer exposing step in a third embodiment of the present invention.

In the third embodiment, a layer of an ARC material 30 is formed on the surface of the second resist layer 16 of FIG. 1 representing the first embodiment to expose the second resist layer 16, as shown in FIG. 6.

The ARC material 30 shown in FIG. 6 functions as an overcoating type ARC. In other words, the ARC material 30 can reduce the multiple interference of the exposure light in the second resist layer 16 to improve the dimensional accuracy in the pattern portion 16a (See FIG. 2).

When the refractive index N of the ARC material 30 relative to the exposure light is smaller than the refractive index n of the second resist layer 16 relative to the exposure light, the multiple interference of the exposure light in the second resist layer 16 can more effectively be reduced. Such an advantage can further be improved when the refractive index N of the ARC material 30 relative to the exposure light is nearly $(n)^{1/2}$. It is further preferable that the thickness d of the layer of the ARC material 30 is substantially equal to $\lambda/4N$ where $\lambda$ is a wavelength of the second exposure light.

The method of the third embodiment can also be applied to the second embodiment.

Fourth Embodiment

Figure 7A:
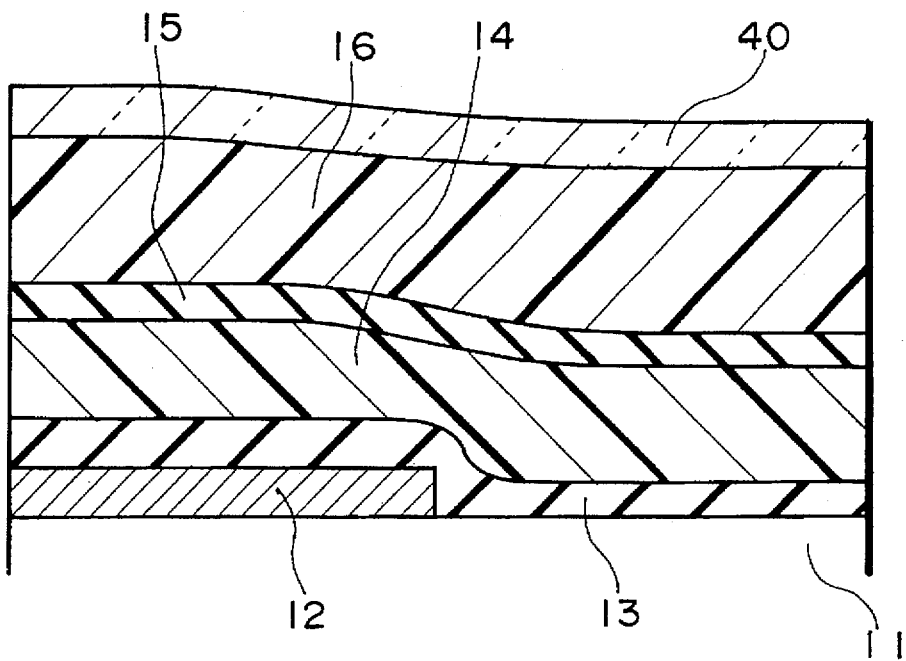
FIG. 7A is a schematic vertical sectional view illustrating a film forming step in a fourth embodiment of the present invention.

As shown in FIG. 7A, in the fourth embodiment, an opaque contrast enhance lithography (CEL) film 40 is formed on the surface of the second resist layer 16.

Figure 7B:
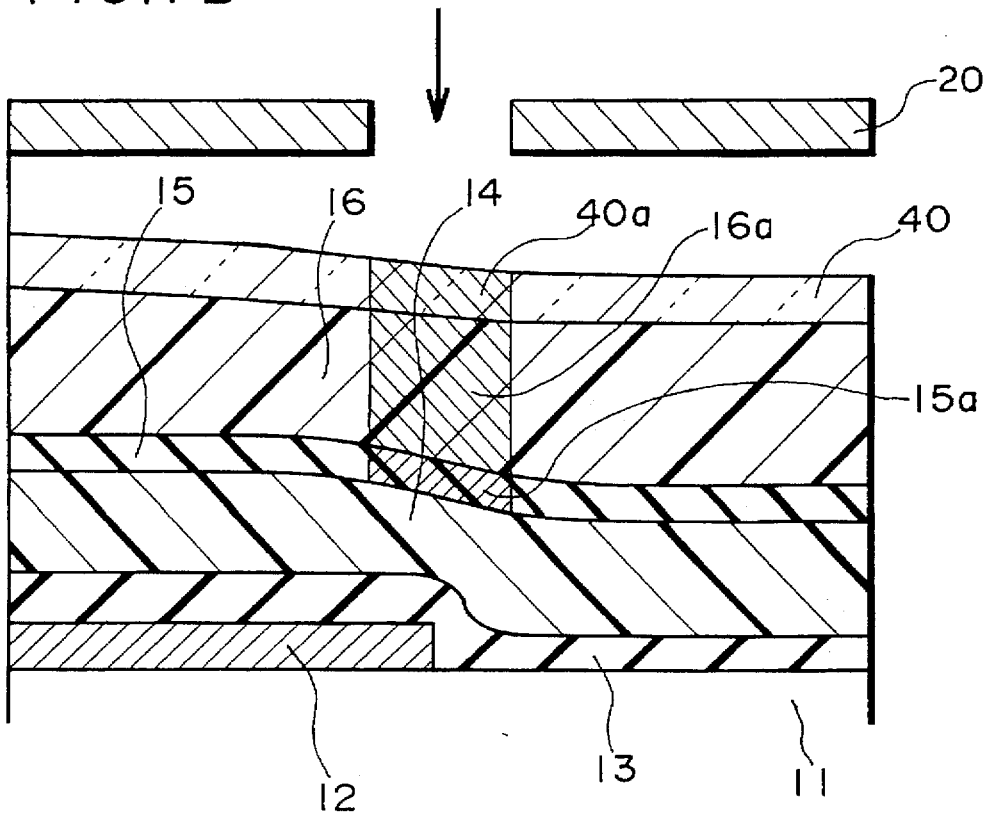
FIG. 7B is a schematic vertical sectional view illustrating a second resist layer exposing step.

As shown in FIG. 7B, the second resist layer 16 is then exposed through a mask 20. As the exposure light enters the CEL film 40 through the mask 20, only a portion 40a exposed to the exposure light is varied to be transparent. Thus, the exposure light enters the second resist layer 16 through the transparent portion 40a. The exposure light hardly enters the portion other than the pattern portion 16a. This further improves the dimensional accuracy in the pattern portion 16a. The method of the fourth embodiment can also be applied to the second embodiment.

Fifth Embodiment

The fifth embodiment will now be described.

Figure 8A:
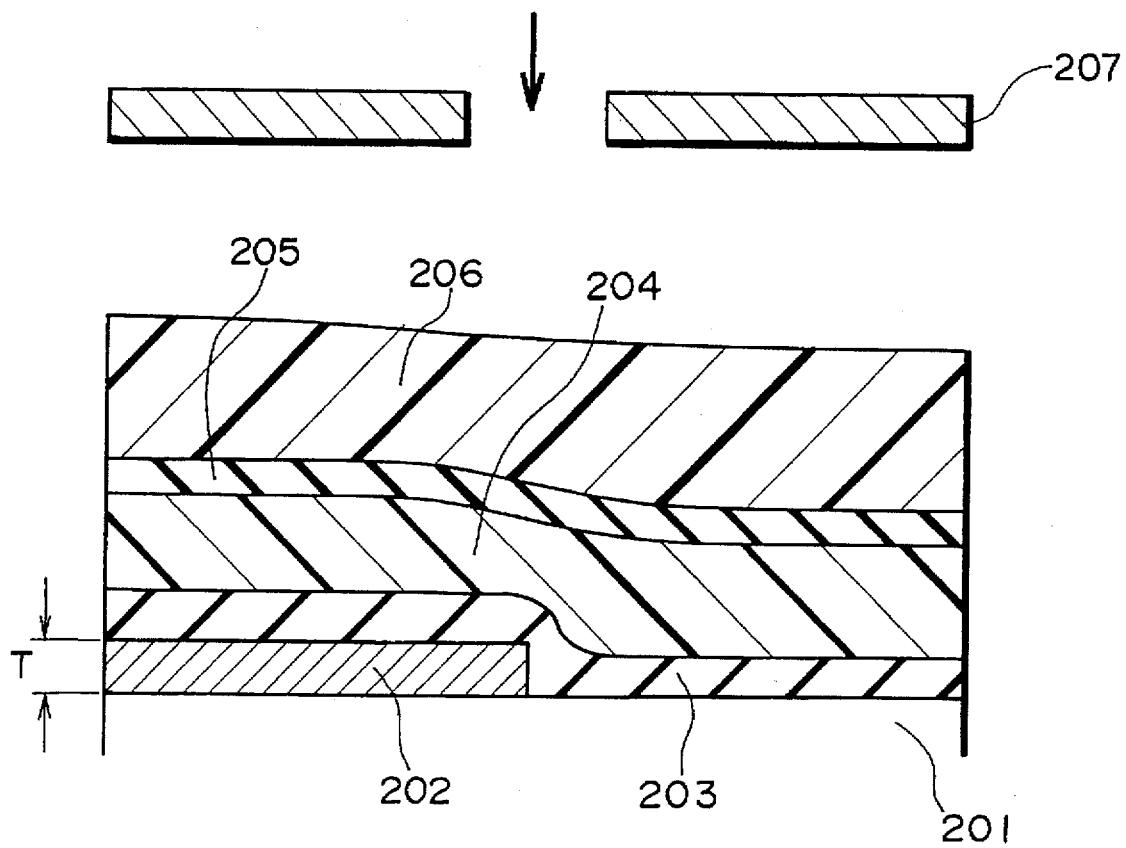
FIG. 8A is a schematic vertical sectional view illustrating a second resist layer exposing step in a fifth embodiment of the present invention.
Figure 8B:
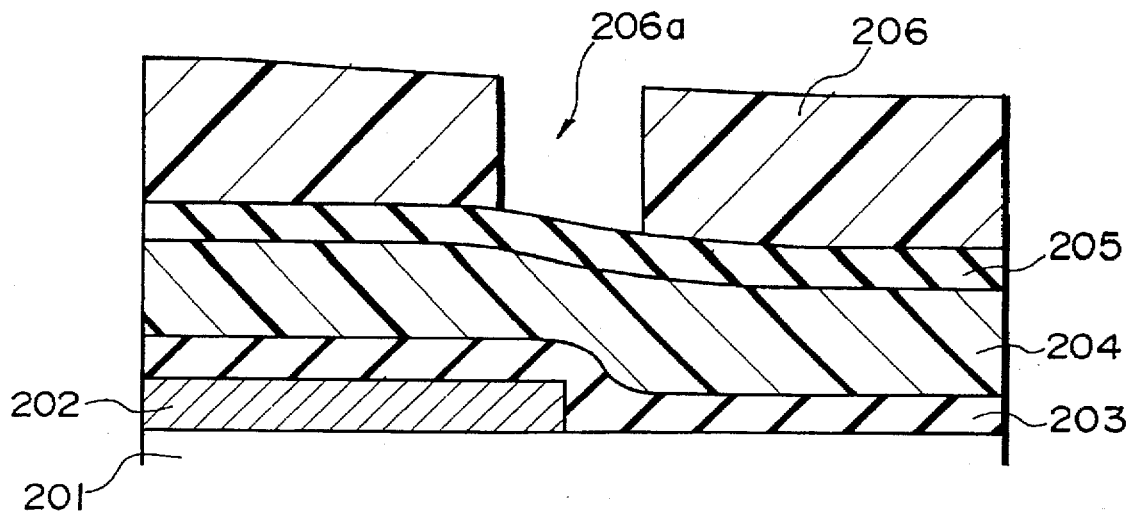
FIG. 8B is a schematic vertical sectional view illustrating a second resist layer developing step carried out after the second resist layer exposing step shown in FIG. 8A.

Referring to FIG. 8A, an aluminum wiring layer 202 which has, for example, a thickness T equal to about 0.4 μm and a layer to be etched 203 comprising oxide film are formed on a substrate 201. As in the first embodiment, a first flattening resist layer 204, a layer of an ARC material 205 and a second resist layer 206 are applied into the respective thickness of about 0.7 μm, 0.2 μm and 1.1 μm.

The first resist layer 204 may be formed of a non-sensitive resist material in this fifth embodiment. However, the first resist layer 204 is not limited to such a material, but may be made of any other non-sensitive material usable in flattening.

The ARC material 205 may either absorb or transmit the exposure light. If the ARC material 205 absorbs the exposure light, the ARC performs the same function as in the first embodiment where the exposure light reflected from either the aluminum wiring layer 202 or the layer to be etched 203 is suppressed so that the reflected exposure light does not influence the pattern formation. Thus, because the reflectance value of the ARC material 205 is lower than the reflectance value of at least one of the aluminum wiring layer 202 and the layer to be etched 203, the accuracy of the pattern formation of the second resist layer 206 is improved.

If the ARC material 205 transmits the exposure light from above, the transmitted light is then reflected by the aluminum wiring layer 202. However, the reflected light entering again the ARC material 205 from below can not upwardly pass through the ARC material 205.

As in the first embodiment, a portion to be exposed 206a of the second resist layer 206 is then exposed through a mask 207 and thereafter developed to remove the portion 206a for forming a resist pattern as shown in FIG. 88. At this time, the reflection of the exposure light from the aluminum wiring layer 202 can be suppressed by the ARC material 205 into such a degree that the formation of pattern will not be influenced by the reflection. Thus, the exposure light will be confined within the first resist layer 204. Since the first resist layer 204 is not-sensitive, it will not be sensitized by the confined light.

The ARC material 205 providing the above advantages is preferably as follows: when the refractive index N of the ARC material 205 relative to the exposure light is smaller than the refractive index n of the first resist layer 16 relative to the exposure light, the reflectance of the ARC material 205 relative to the light from the underlayer can be increased. It is particularly preferred that the refractive index N of the ARC material 205 relative to the exposure light is nearly $(n)^{1/2}$. It is further preferable that the thickness d of the layer of the ARC material 205 is substantially equal to $\lambda/2N$ where $\lambda$ is a wavelength of the exposure light.

When the portion to be exposed 206a of the second resist layer 206 is to be removed through development, the ARC material 205 located below the portion to be exposed 206a does not have solubility relative to the alkaline developer, unlike the first embodiment. Thus, the ARC material 205 remains after development.

Figure 9A:
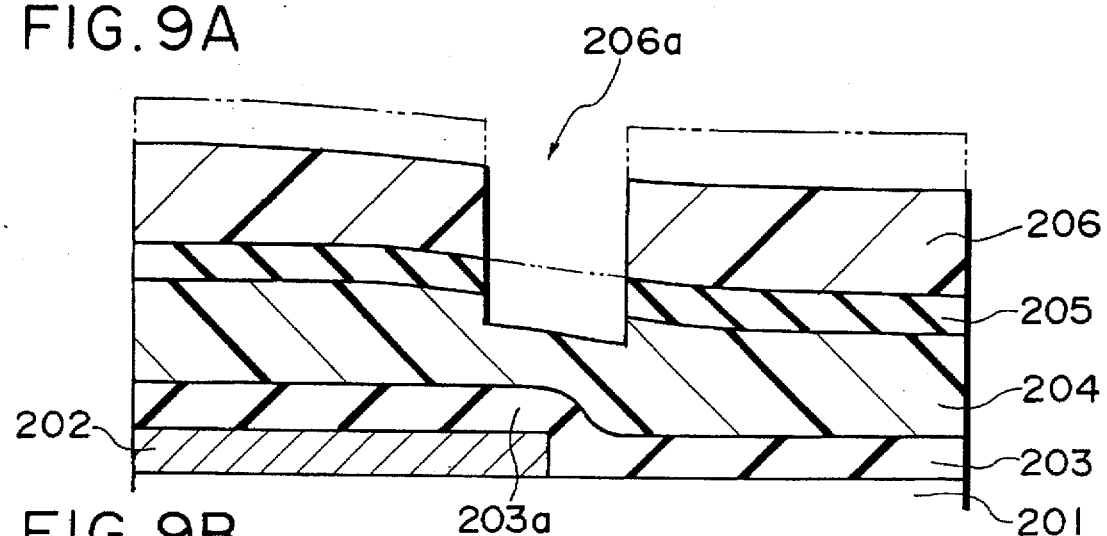
FIGS. 9A–9C are schematic vertical sectional views respectively illustrating the progress of a step of overall etching a thin film on a substrate.
Figure 9B:
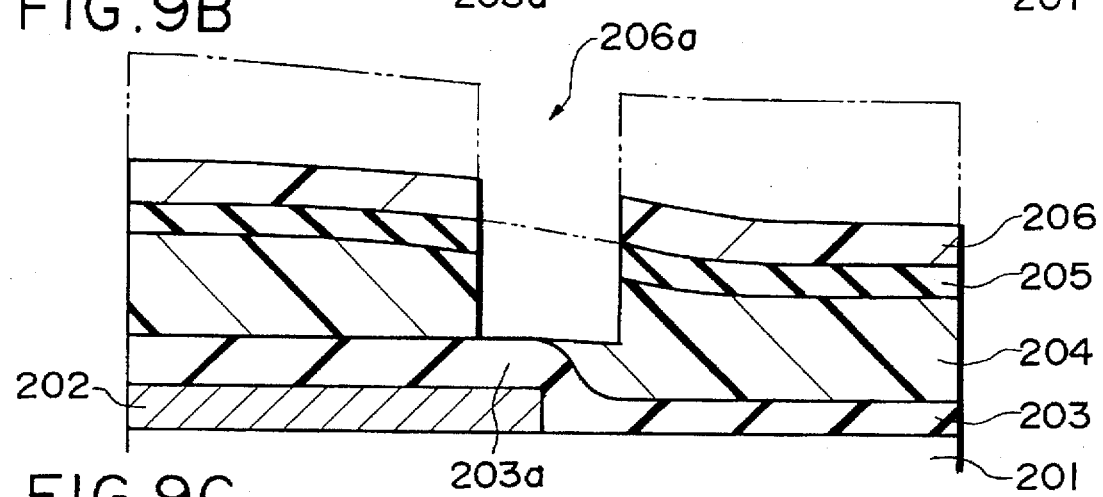
Figure 9C:
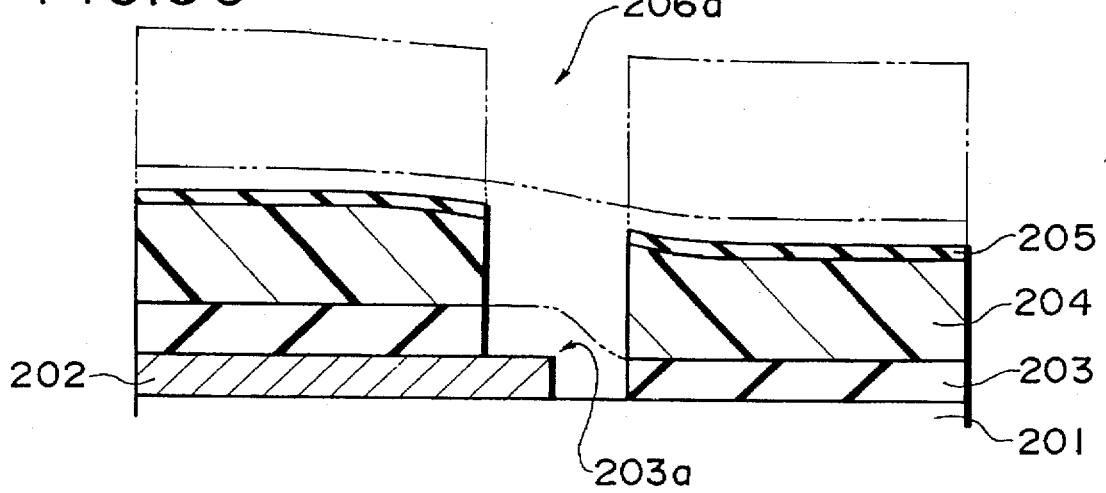
Figure 10:
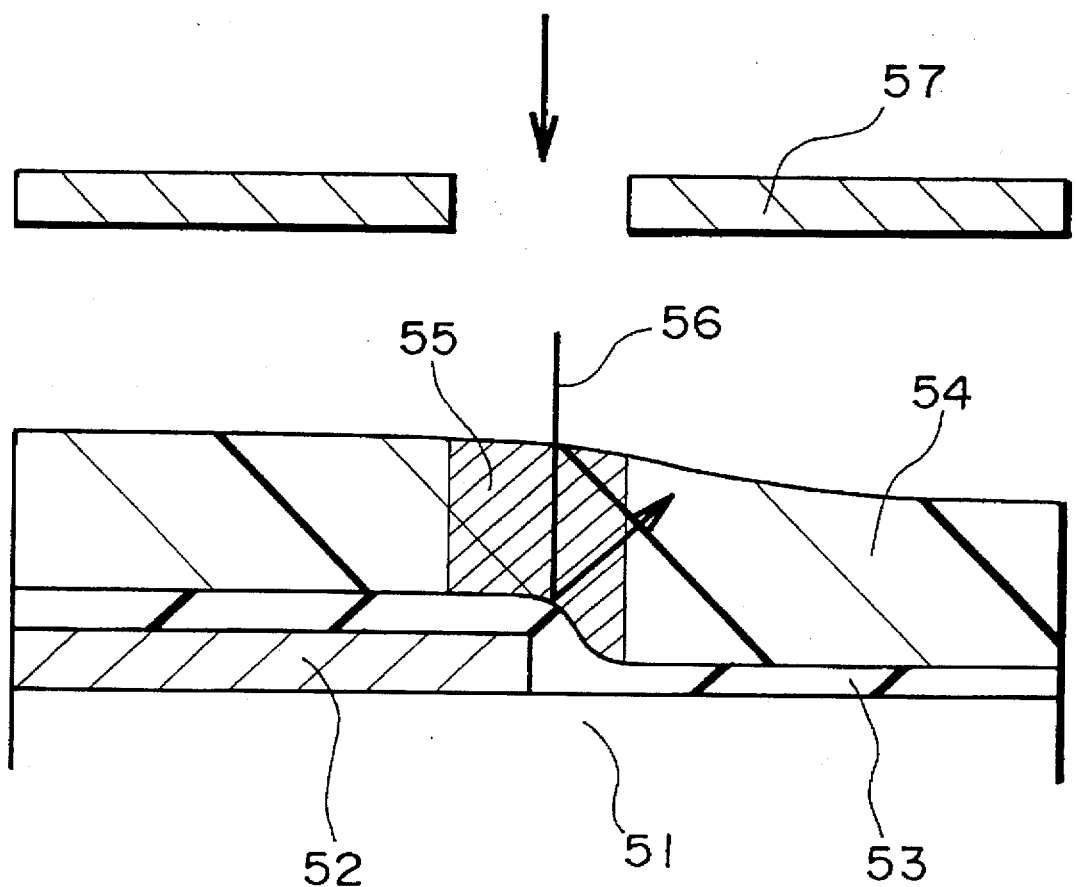
FIG. 10 is a schematic vertical sectional view illustrating an exposing step according to the prior art.
Figure 11A:
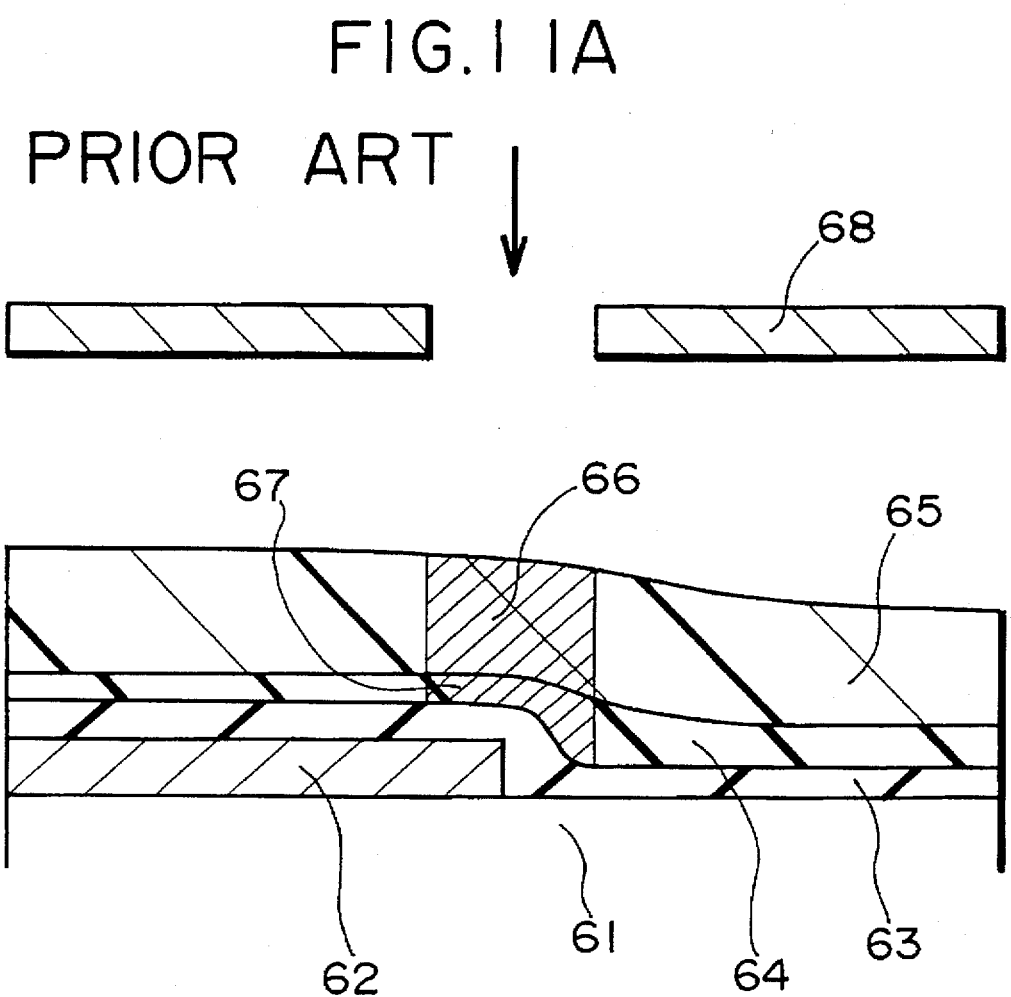
FIG. 11A is a schematic vertical sectional view illustrating another exposing step according to the prior art.
Figure 11B:
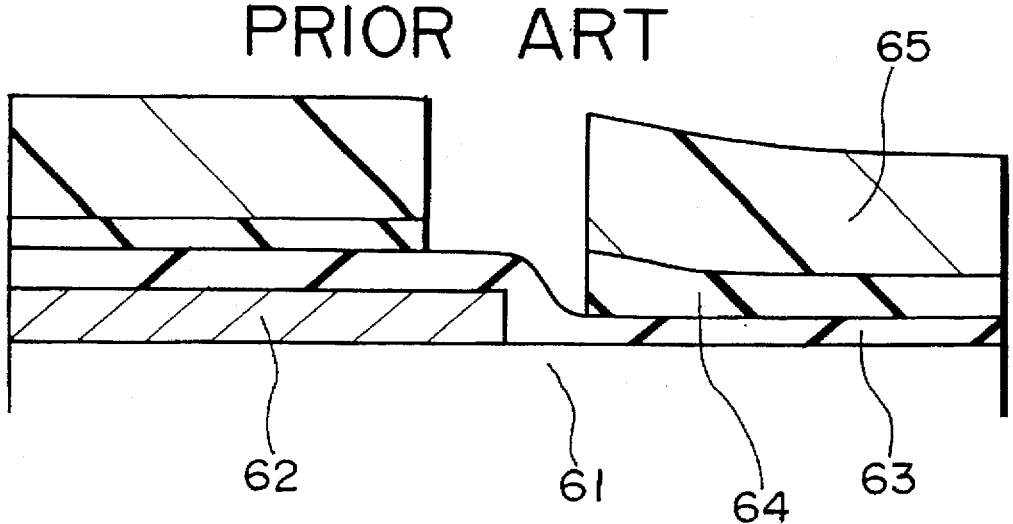
FIG. 11B is a schematic vertical sectional view illustrating a developing step after the exposing step shown in FIG. 11A.

The fifth embodiment is different from the aforementioned embodiments in that the overall surface of the thin layers on the substrate 201 is processed by an anisotropic etching process rather than the lithographic process in the subsequent steps, as shown in FIGS. 9A to 9C.

When the overall surface of the thin layers on the substrate 201 is processed, etching against the portions of the thin layers opposed to the portion to be exposed 206a of the second resist layer 206 sequentially progresses from the ARC material 205 toward the lower layers. On the other hand, etching against the other portions of the layers not opposed to the portion to be exposed 206a of the second resist layer 206 will sequentially progress from the second resist layer 206 toward the lower layers.

When the overall surface of the layers on the substrate is processed, etching against the portions opposed to the portion to be exposed 206a of the second resist layer 206 progresses while the upper layers function as masks, as shown in FIGS. 9A and 9B. In the portions opposed to the portion to be exposed 206a, etching of the layer to be etched 203 will be initiated at a time earlier than the other portions, as shown in FIG. 9B. In addition, the layer to be etched 203 can be removed only at the portion 203a opposed to the portion to be exposed 206a of the second resist layer 206 when the film thickness of the second resist layer 206 is sufficiently larger than the height T of the step 210 that is equal to the film thickness of the aluminum wiring layer 202. This is because the first resist layer 204 necessarily exists at the portion not opposed to the portion to be exposed 206a of the second resist layer 206 during the etching of the portion to be etched 203a, and this first resist layer 204 functions as a mask.

Since the second resist layer having the etching resistance is initially etched in the portions not opposed to the portion to be exposed 206a of the second resist layer 206, that etching speed becomes sufficiently slower than the etching speed in the ARC material 205. Thus, only the portion to be etched 203a can be etched.

The dimensional controllability in the fifth embodiment depends on the anisotropy during the etching process. Therefore, a high-anisotropic etching process, for example, a reactive ion etching (RIE) process, an etching process using Electron Cyclotron Resonance(ECR) type ion source through microwave excitation or the like is suitable for the present invention.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A method for making a semiconductor device, a substrate of the semiconductor device having a first layer and a second layer, the first layer being disposed over a portion of a surface of the substrate forming a first step between a surface level of the substrate and a surface level of the first layer, the second layer being disposed over the first layer and the surface of the substrate covering the first step, the method comprising:

forming a first resist layer on the second layer, the first resist layer forming a second step over the first step, a height of the second step being less than a height of the first step by at least about 70%, the first resist layer having a thickness less than about 1.5 µm and being sensitive to a first exposure light;

forming a first anti-reflection coat on the first resist layer, the first anti-reflection coat having a thickness less than about 0.2 µm and having a first reflectance value relative to the second exposure light and the first and second layers having a second reflectance value and a third reflectance value, respectively, relative to the second exposure light, the first reflectance value being less than at least one of the second and third reflectance values;

forming a second resist layer on the first anti-reflection coat, the second resist layer being sensitive to the second exposure light;

forming a first pattern on the second resist layer by exposing the second resist layer to the second exposure light and developing the second resist layer;

forming a second pattern on the first anti-reflection coat, the second pattern being substantially the same as the first pattern on the second resist layer;

forming a third pattern on the first resist layer by exposing the first resist layer to the first exposure light and developing the first resist layer, the third pattern being formed using the second resist layer and the first anti-reflection coat as a first mask and a second mask, the third pattern being substantially the same pattern as the first pattern on the second resist layer; and etching the second layer using at least the first resist layer as a third mask.

2. The method of claim 1, wherein the second resist layer has a higher resolution than the first resist layer.

3. The method of claim 1, wherein the first resist layer has a higher light sensitivity than the second resist layer.

4. The method of claim 1, wherein the first resist layer comprises a light absorbing agent.

5. The method of claim 1, wherein the step of forming the second pattern on the first anti-reflection coat includes:

wet-etching the first anti-reflection coat using the second resist layer as a mask.

6. The method of claim 1, wherein the step of forming the second pattern on the first anti-reflection coat includes:

dry-etching the first anti-reflection coat using the second resist layer as the first mask.

7. The method of claim 1, further comprising:

forming a second anti-reflection coat on the second resist layer for preventing a multiple interference of the second exposure light in the second resist layer when the second resist layer is exposed to the second exposure light.

8. The method of claim 7, wherein a refractive index N of the second anti-reflection coat relative to the second exposure light is less than a refractive index n of the second resist layer relative to the second exposure light, a film thickness d of the second anti-reflection coat being substantially equal to $\lambda/4N$ where $\lambda$ is a wavelength of the second exposure light.

9. The method of claim 1, further comprising:

forming an opaque film over the second resist layer; and exposing a part of the opaque film to the second exposure light to change the part of the opaque film into a transparent portion before forming the first pattern on the second resist layer, wherein the second resist layer is exposed to the second exposure light through the transparent portion when forming the first pattern on the second resist layer.

10. The method of claim 1, wherein the first exposure light is an excimer laser beam.

11. The method of claim 1, wherein the second exposure light includes one of an i-ray laser beam and an excimer laser beam.

12. A method for making a semiconductor device, a substrate of the semiconductor device having a first layer and a second layer, the first layer being disposed over a portion of a surface of the substrate forming a first step between a surface level of the substrate and a surface level of the first layer, the second layer being disposed over the first layer and the surface of the substrate covering the first step, the method comprising:

forming a first resist layer on the second layer, the first resist layer forming a second step over the first step, a height of the second step being less than a height of the first step by at least about 70%, the first resist layer having a thickness less than about two times the height of the first step and being sensitive to a first exposure light;

forming a first anti-reflection coat on the first resist layer having a thickness less than about 0.2 µm, the first anti-reflection coat having a first reflectance value relative to the second exposure light and the first and second layers having a second reflectance value and a third reflectance value, respectively, relative to the second exposure light, the first reflectance value being less than at least one of the second and third reflectance values;

forming a second resist layer on the first anti-reflection coat, the second resist layer being sensitive to the second exposure light;

forming a first pattern on the second resist layer by exposing the second resist layer to the second exposure light and developing the second resist layer;

forming a second pattern on the first anti-reflection coat, the second pattern being substantially the same as the first pattern on the second resist layer;

forming a third pattern on the first resist layer by exposing the first resist layer to the first exposure light and developing the first resist layer, the third pattern being formed using the second resist layer and the first anti-reflection coat as a first mask and a second mask, the third pattern being substantially the same pattern as the first pattern on the second resist layer; and etching the second layer using at least the first resist layer as a third mask.

13. A method for making a semiconductor device, a substrate of the semiconductor device having a first layer and a second layer, the first layer being disposed over a portion of a surface of the substrate forming a first step between a surface level of the substrate and a surface level of the first layer, the second layer being disposed over the first layer and the surface of the substrate covering the first step, the method comprising:

forming a flattening layer on the second layer, the flattening layer forming a second step over the first step, a height of the second step being less than a height of the first step;

forming an anti-reflection coat on the flattening layer, the anti-reflection coat having a first reflectance value relative to an exposure light and the first and second layers having a second reflectance value and a third reflectance value, respectively, relative to the exposure light, the first reflectance value being less than at least one of the second and third reflectance values;

forming a resist layer on the anti-reflection coat, the resist layer having a thickness greater than the height of the first step and being sensitive to the exposure light;

forming a pattern on the resist layer by exposing the resist layer to the exposure light and developing the resist layer; and anisotropically etching the resist layer, the anti-reflection coat, the flattening layer and the second layer using the pattern formed on the resist layer as a mask.

14. The method of claim 13, wherein a height of the second step is less than a height of the first step by at least about 70% and a thickness of the flattening layer is equal to or less than about 1.5 µm.

15. The method of claim 13, wherein a height of the second step is less than a height of the first step by at least about 70% and a thickness of the flattening layer is less than two times the height of the first step.

16. The method of claim 13, wherein the anti-reflection coat has a thickness equal to or less than about 0.2 µm.

17. A method for making a semiconductor device, a substrate of the semiconductor device having a first layer and a second layer, the first layer being disposed over a portion of a surface of the substrate forming a first step between a surface level of the substrate and a surface level of the first layer, the second layer being disposed over the first layer and the surface of the substrate covering the first step, the method comprising:

- forming a flattening layer on the second layer, the flattening layer forming a second step over the first step, a height of the second step being less than a height of the first step;
- forming an anti-reflection coat on the flattening layer, a portion of an exposure light being transmitted through the anti-reflection coat when exposed to the exposure light, the portion of the exposure light transmitted through the anti-reflection coat being confined within the flattening layer;
- forming a resist layer on the anti-reflection coat, the resist layer having a thickness greater than the height of the first step and being sensitive to the exposure light;
- forming a pattern on the resist layer by exposing the resist layer to the exposure light and developing the resist layer; and
- anisotropically etching the resist layer, the anti-reflection coat, the flattening layer and the second layer using the pattern formed on the resist layer as a mask.

18. The method of claim 17, wherein a refractive index N of the anti-reflection coat relative to the exposure light is less than a refractive index n of the resist layer relative to the exposure light, a film thickness d of the anti-reflection coat being substantially equal to $\lambda/2N$ where $\lambda$ is a wavelength of the exposure light.

19. The method of claim 17, wherein the flattening layer is not sensitive to the exposure light.

20. The method of claim 17, wherein a height of the second step is less than a height of the first step by at least about 70% and a thickness of the flattening layer is equal to or less than about 1.5 µm.

21. The method of claim 17, wherein a height of the second step is less than a height of the first step by at least about 70% and a thickness of the flattening layer is less than two times the height of the first step.

22. The method of claim 17, wherein the anti-reflection coat has a thickness equal to or less than about 0.2 µm.

* * * * *